(12) United States Patent
Dalton et al.

(10) Patent No.: US 6,873,027 B2
(45) Date of Patent: Mar. 29, 2005

(54) ENCAPSULATED ENERGY-DISSIPATIVE FUSE FOR INTEGRATED CIRCUITS AND METHOD OF MAKING THE SAME

(75) Inventors: Timothy J. Dalton, Ridgefield, CT (US); Kevin S. Petrarca, Newburgh, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/002,447

(22) Filed: Oct. 26, 2001

(65) Prior Publication Data

US 2003/0080393 A1 May 1, 2003

(51) Int. Cl.[7] ............................................. H01L 29/00
(52) U.S. Cl. ..................................................... 257/529
(58) Field of Search ................................. 257/173, 529, 257/665, 910, 919

(56) References Cited

U.S. PATENT DOCUMENTS

| | | | |
|---|---|---|---|
| 4,531,144 A | | 7/1985 | Holmberg |
| 4,556,897 A | | 12/1985 | Yorikane et al. |
| 4,740,485 A | | 4/1988 | Sharpe-Geisler |
| 4,826,785 A | | 5/1989 | McClure et al. |
| 4,935,801 A | | 6/1990 | McClure et al. |
| 5,252,844 A | * | 10/1993 | Takagi ........................ 257/296 |
| 5,321,300 A | | 6/1994 | Usuda et al. |
| 5,389,814 A | * | 2/1995 | Srikrishnan et al. ......... 257/529 |
| 5,585,663 A | * | 12/1996 | Bezama et al. .............. 257/529 |
| 5,590,460 A | * | 1/1997 | DiStefano et al. ............. 29/830 |
| 5,602,053 A | | 2/1997 | Zheng et al. |
| 5,608,257 A | | 3/1997 | Lee et al. |
| 5,705,849 A | | 1/1998 | Zheng et al. |
| 5,830,797 A | | 11/1998 | Cleeves |
| 5,955,773 A | * | 9/1999 | Stamper ...................... 257/529 |
| 5,974,661 A | | 11/1999 | Neuhalfen |
| 5,982,268 A | * | 11/1999 | Kawanishi .................. 337/297 |
| 5,989,623 A | | 11/1999 | Chen et al. |
| 6,023,028 A | | 2/2000 | Neuhalfen |
| 6,033,939 A | * | 3/2000 | Agarwala et al. ........... 438/132 |
| 6,111,301 A | * | 8/2000 | Stamper ...................... 257/529 |
| 6,121,073 A | | 9/2000 | Huang et al. |

(Continued)

FOREIGN PATENT DOCUMENTS

| | | | | |
|---|---|---|---|---|
| JP | 58-165347 | 9/1983 | ..................... | 21/88 |
| JP | 58196231 A | 11/1983 | ..................... | 69/44 |
| JP | 9017790 A | 1/1997 | | |

OTHER PUBLICATIONS

Charles A. Harper, Electronic Packaging and Interconnection Handbook, McGraw–Hill, p. 10.36.*
United States Court of Appeals for the Federal Circuit, "EMI Group North America, Inc. v. Cypress Semiconductor Corporation," Decided Sep. 21, 2001, pp. 2–13.
Bill Travis, "Protection Devices Put the Brakes on Faults," EDN Europe, Feb. 3, 2000, pp. 87–94.

*Primary Examiner*—Amir Zarabian
*Assistant Examiner*—Monica Lewis
(74) *Attorney, Agent, or Firm*—Margaret A. Pepper; Cantor Colburn LLP

(57) ABSTRACT

A laser-programmable fuse structure for an integrated circuit device is disclosed. In an exemplary embodiment of the invention, the fuse structure includes a conductive layer, the conductive layer completing a conductive path between wiring segments in a wiring layer. An organic material is encapsulated underneath the conductive layer, wherein the fuse structure is blown open by application of a beam of laser energy thereto.

9 Claims, 3 Drawing Sheets

U.S. PATENT DOCUMENTS

| | | |
|---|---|---|
| 6,156,651 A | 12/2000 | Havemann |
| 6,160,302 A | 12/2000 | Palagonia |
| 6,162,686 A * | 12/2000 | Huang et al. ............... 438/281 |
| 6,163,062 A | 12/2000 | Shiratake et al. |
| 6,191,928 B1 | 2/2001 | Rector et al. |
| 6,242,790 B1 | 6/2001 | Tsui et al. |
| 6,259,146 B1 * | 7/2001 | Giust et al. ................. 257/529 |
| 6,300,233 B1 * | 10/2001 | Lee et al. .................... 438/601 |
| 6,440,834 B2 * | 8/2002 | Daubenspeck et al. ..... 438/601 |
| 2002/0084507 A1 * | 7/2002 | Barth ......................... 257/529 |

* cited by examiner

ENCAPSULATED ENERGY-DISSIPATIVE FUSE FOR INTEGRATED CIRCUITS AND METHOD OF MAKING THE SAME

BACKGROUND

The present invention relates generally to integrated circuit devices and, more particularly, to an encapsulated, energy-dissipative fuse for use with integrated circuit devices such as a dynamic random access memory (DRAM).

Semiconductor integrated circuits (ICs) and their manufacturing techniques are well known. In a typical integrated circuit, a large number of semiconductor devices are fabricated on a silicon substrate. To achieve the desired functionality of the IC, a plurality of conductors (i.e., metallization layers) are provided to electrically connect selected devices together. In some integrated circuits, conductive lines are coupled to fuses, which fuses may be cut or blown to create an open circuit. For example, in a dynamic random access memory (DRAM) circuit, fuses may be used in conjunction with isolating failing memory array elements and replacing them with redundant array elements. In logic circuits, fuses may also be used to select or modify certain circuit performance or functions.

Laser fusible links are one example of such fuse devices, and are generally formed from conductive lines that can be explosively fused open by the application of laser energy thereto. The applied laser energy causes a portion of the link material to vaporize and a portion of the material to melt. Typically, the fusible link is relatively narrow as compared to the remainder of the conductive structure, and may be composed of materials such as aluminum or polysilicon. Alternatively, a fuseable link may be made of the same metal material as the chip conductors themselves.

In order to intentionally blow such a fuse, a short pulse of laser energy is impinged upon the fuse at a predetermined spot thereon. Since every fuse in an IC is not necessarily blown by design, care is taken to ensure that adjacent fuses are not blown by the applied laser energy. Because of the possibility of laser-induced damage, the areas underlying the fuses are typically devoid of semiconductor devices (e.g., transistors) and the fuses are spaced relatively far apart in conventional systems. Another existing approach to preventing the unintentional blowing of adjacent fuses is to reduce the intensity of the applied laser energy. However, in so doing, it is possible that the fuse material might not completely be ablated or vaporized by the laser. As a result, any fuse material removed by the laser could simply be liquified and then re-solidified, thereby potentially causing a short circuit of an adjacent fuse or device, perhaps even reclosing the very fuse sought to be blown open.

On the other hand, the absorption of excessive laser energy by an IC device may also result in unwanted damage to the IC substrate or to an insulating layer(s) adjacent to the fuse device. With the use of so called "low-κ" (low dielectric constant) materials as insulating layers becoming increasingly common in IC fabrication, there is an increased emphasis on reducing the amount of laser energy needed to blow a fuse, since these low-κ materials are generally more susceptible to laser-induced damage. Accordingly, it becomes a difficult proposition to design a fuse structure which is capable of blowing with lower applied laser energy, but still sufficiently ablates so as not to result in short circuiting of other components.

BRIEF SUMMARY

The above discussed and other drawbacks and deficiencies of the prior art are overcome or alleviated by a laser-programmable fuse structure for an integrated circuit device. In an exemplary embodiment of the invention, the fuse structure includes a conductive layer, the conductive layer completing a conductive path between wiring segments in a wiring layer. An organic material is encapsulated underneath the conductive layer, wherein the fuse structure is blown open by application of a beam of laser energy thereto.

In a preferred embodiment, a liner material is in electrical contact with the wiring segments and the conductive layer, the liner material further encapsulating the organic material between the wiring layer and the conductive layer. The organic material is selected from a group that includes a polyimide, a polyamide, a polyarlyene ether, a polyaromatic hydrocarbon (PAH), and a conductive polyaniline. The liner material and conductive layer are selected from a group that includes TaN, Ta, TiN, Ti, W, WN, TaSiN, TiSiN, or alloys therefrom.

Preferably, the fuse structure further includes a pair of vias formed within an insulating layer and extending down to the wiring segments. A mesa region of the insulating layer is thereby formed between the pair of vias, wherein the liner material is formed upon sides of the mesa region and the wiring segments. The pair of vias is filled with the organic material, which further occupies an inner area of the fuse structure. The inner area is between the top of the mesa region and the conductive layer. The conductive layer covers the inner area and the organic material, thereby completing the conductive path.

BRIEF DESCRIPTION OF THE DRAWINGS

Referring to the exemplary drawings wherein like elements are numbered alike in the several FIGS..

DETAILED DESCRIPTION

A novel fuse structure and accompanying method for forming the same is disclosed herein which overcomes or alleviates the above described drawbacks. Broadly stated, an organic material is encapsulated beneath a thin, conductive layer, thereby forming a fuse structure that can be blown by a relatively low-energy laser beam. When the conductive layer is subjected to laser energy, the encapsulated organic material therein is rapidly volatized, thus explosively opening the fuse.

Figure 1:
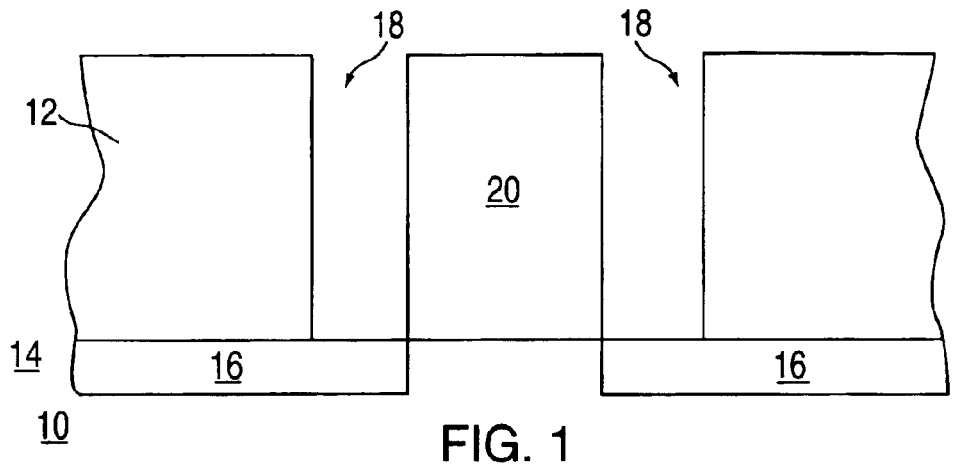
FIGS. 1 through 8 are cross-sectional views of a method for forming an encapsulated, energy-dissipating fuse structure, in accordance with an embodiment of the invention.

Referring generally to FIGS. 1 through 8, there is illustrated a method for forming an encapsulated, energy-dissipating fuse structure, in accordance with an embodiment of the invention. In FIG. 1, a semiconductor wafer 10 has a passivation or insulating layer 12 formed thereupon as topmost level of a semiconductor device. Passivation layers are well known in the art and provide a measure of protection for the lower level components (e.g., metallization layers) from oxidation and external moisture penetration, among other things. In addition, passivation layer 12 may serve as a diffusion barrier against the upward diffusion of metallic atoms (e.g., copper) from the lower levels of the semiconductor device. Examples of passivation layer 12 include, but are not limited to, silicon dioxide ($SiO_2$), silicon nitrides ($SiN_x$), silicon oxynitrides ($SiO_xN_y$), silicon carbides (SiC), etc., or combinations thereof. In the embodiment shown, a upper metallization layer 14 includes wiring segments 16 to be joined by a fuse structure. Wiring segments 16 may be made from a conductive material such as copper, aluminum, tungsten, silicon, etc., or combinations thereof.

Figure 2:
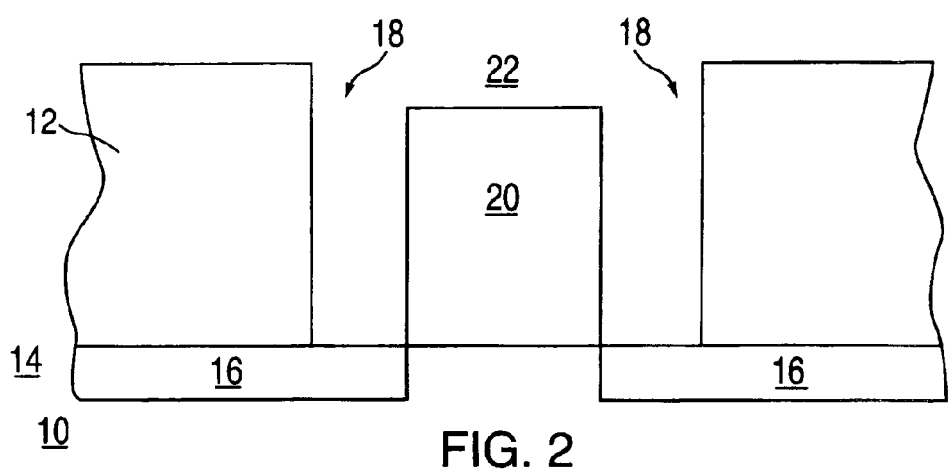

Next, a pair of vias (openings) 18 are formed through passivation layer 12 by standard lithography, etching and cleaning techniques, such that vias 18 extend down to (and are at least partially aligned with) the ends of wiring segments 16. Although a dry plasma etching process is preferred, any suitable etching techniques may be implemented. The distance between the outer ends of vias 18 will ultimately determine the length of the fuse structure. As a result of the etching of vias 18, a mesa 20 of passivation material is defined therebetween. In FIG. 2, a portion of the mesa 20 is subsequently removed by additional photolithography, etching and cleaning steps, thereby defining an inner area 22 of the fuse structure.

Figure 3:
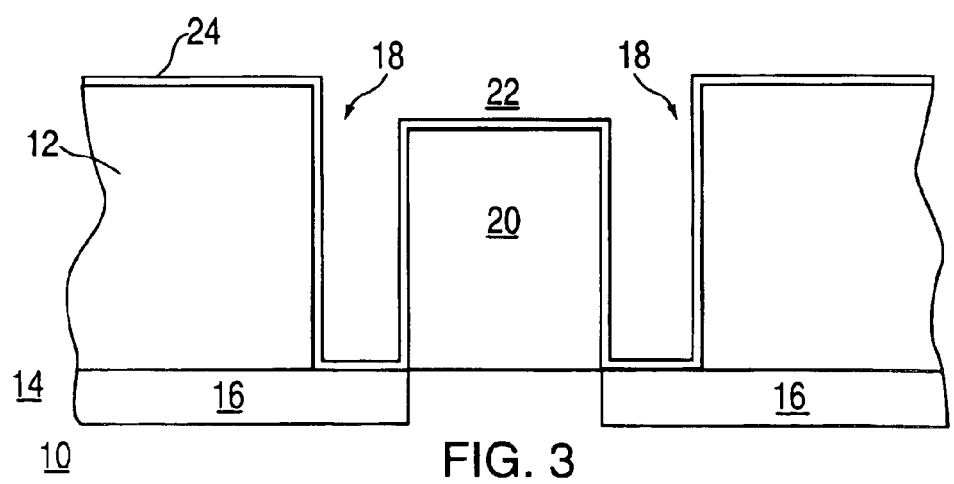

Referring now to FIG. 3, a liner material 24 is formed over the top of passivation layer 12, as well as the sides and bottom of vias 18 and the top of mesa 20. Liner material 24 is a conductive material which also acts as a diffusion barrier to protect metallization layer 14 from oxidation, external moisture penetration and upward diffusion of the metallic atoms therein. The liner material 24 may be formed by deposition of refractory metals or alloys such as (but not limited to) TaN, Ta, TiN, Ti, W, WN, TaSiN, TiSiN, a combination thereof, or any material known to those skilled in the art to be a good liner material.

Figure 4:
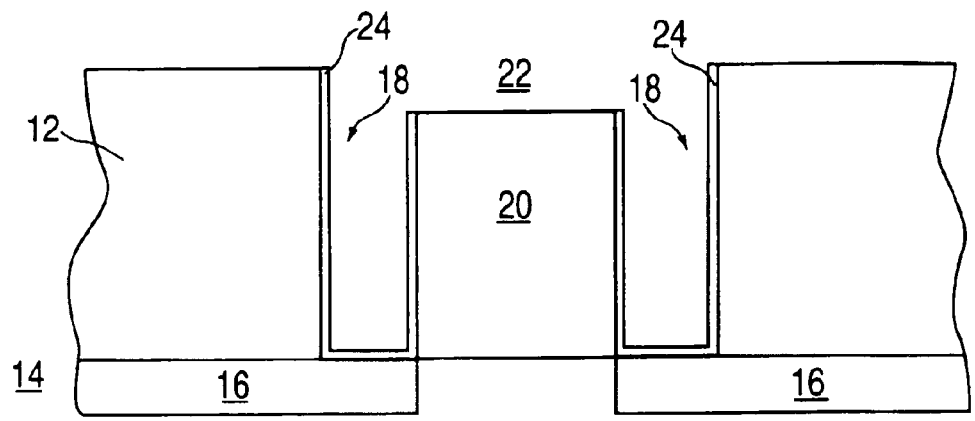

In FIG. 4, the liner material 24 formed atop passivation layer 12 and mesa 20 is removed. Particularly, the removal of a portion of the liner material 24 atop mesa 20 is done so as to prevent a short circuit (between wiring segments 16) from being created at the bottom of the fuse structure, as opposed to on the top of the completed fuse structure. The remaining liner material 24 following the removal process thus covers the vertical and bottom surfaces of vias 18.

In order to remove the liner material 24 both atop the passivation layer 12, as well as the portion atop mesa 20, chemical mechanical polishing (CMP) with a soft pad is applied thereto. With many CMP operations, a hard pad is used so as to avoid an undesired dishing effect in which more material is removed from the central area of a polish than from the sides. In this case, however, dishing is a desired effect since the portion of liner material 24 atop mesa 20 sits lower than the remaining liner material 24 atop passivation layer 12. Thus, a soft pad is preferred with the CMP process to remove non-coplanar levels of liner material. As an alternative to a chemical mechanical polish, liner material 24 may also be removed by plasma etching. To remove the portion atop mesa 20, a masked reactive ion etch (RIE) may be used, whereas a blanket RIE may be used to etch back the remainder of liner material 24 atop passivation layer 12. Etching is not a preferred removal process for this step, however, due to the associated cost of the photolithography step used to form the mask.

Figure 5:
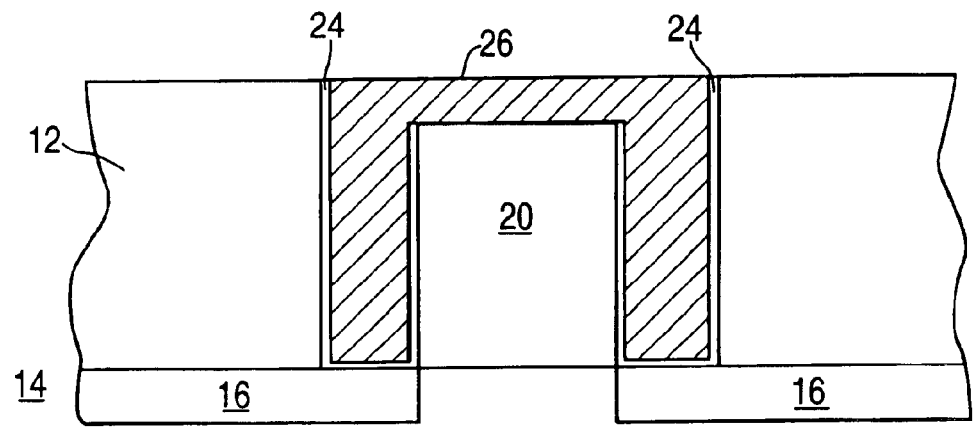

Next, the inner area 22 (shown in FIGS. 2–4) of the fuse structure is filled with an organic material 26, and planarized to the top of passivation layer 12, as illustrated in FIG. 5. The organic material 26 will form the encapsulated material of the final fuse structure, and is preferably a spin-on material such as a polyimide, a polyamide, a polyarlyene ether, a polyaromatic hydrocarbon (PAH), a conductive polyaniline, or any other suitable organic material known to one skilled in the art. Examples of such suitable organics include, but are not limited to, SiLK® (manufactured by Dow Chemical Company), Flare (manufactured by Allied Signal Corp.), PAE2, Velox (both manufactured by Schumacher Co.), Ormecon® (developed by Zipperling Kessler & Co., and sold by Honeywell Corporation), diamond-like carbon (DLC), and paralyene compounds. Furthermore, the organic material 26 may be a gap filling material (which fills all the way into vias 18 as shown in FIG. 5) or a non-gap filling material, so long as sufficient material is formed in inner area 22 and atop mesa 20. However, a gap filling material is preferred.

Figure 6:
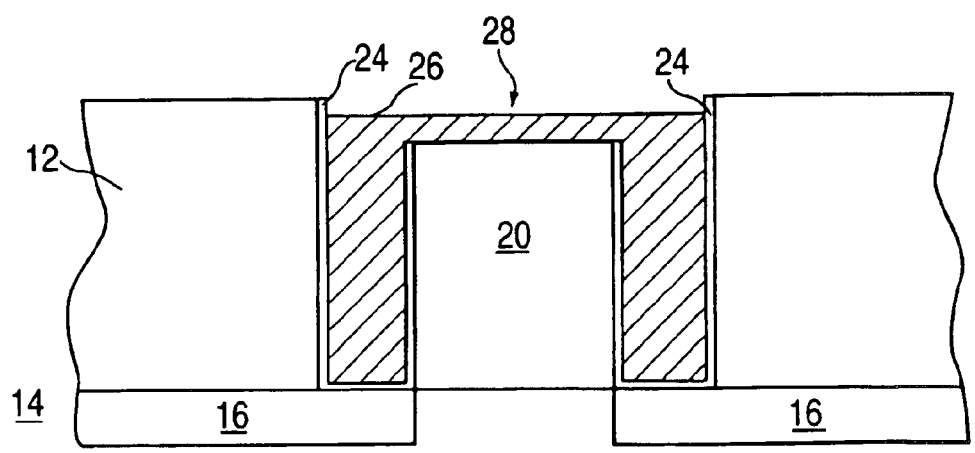

Referring now to FIG. 6, the organic material 26 is then recessed from the top of passivation layer 12 by an $O_2$ plasma RIE process. Thereby, a recess 28 is created at the top of the fuse structure to allow for the formation of a conductive layer atop the organic material 26, as will be described. If oxidation becomes a concern during the organic recess process, other etch gas chemistries may be used. Other possible etch gasses include, but are not limited to, $N_2$, $H_2$, $NH_3$, $N_2H_2$, $CO$, $CO_2$, $CH_3F$, $CH_2F_2$, $CHF_3$, $CF_4$, or any combination thereof. As an alternative to etching, the organic material 26 may also be recessed by chemical mechanical polishing.

Figure 7:
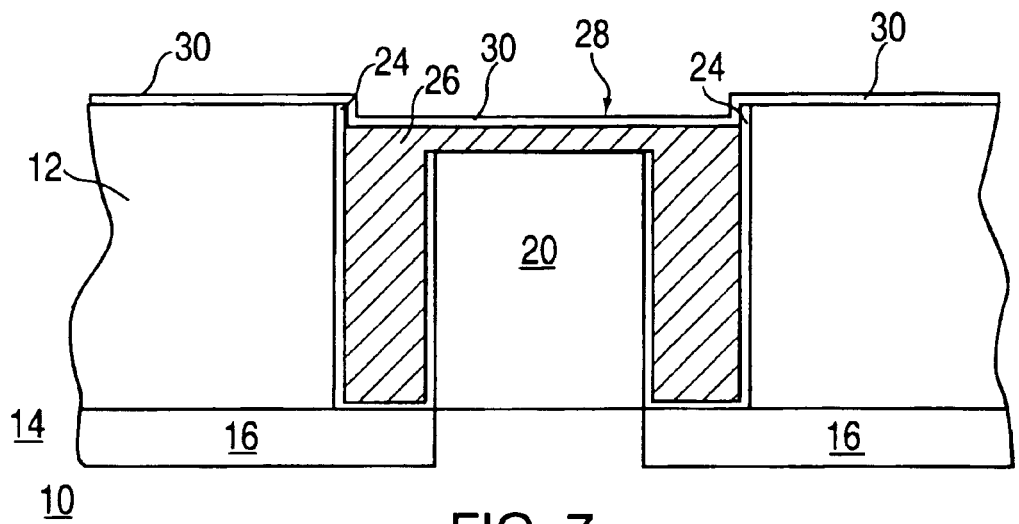
Figure 8:
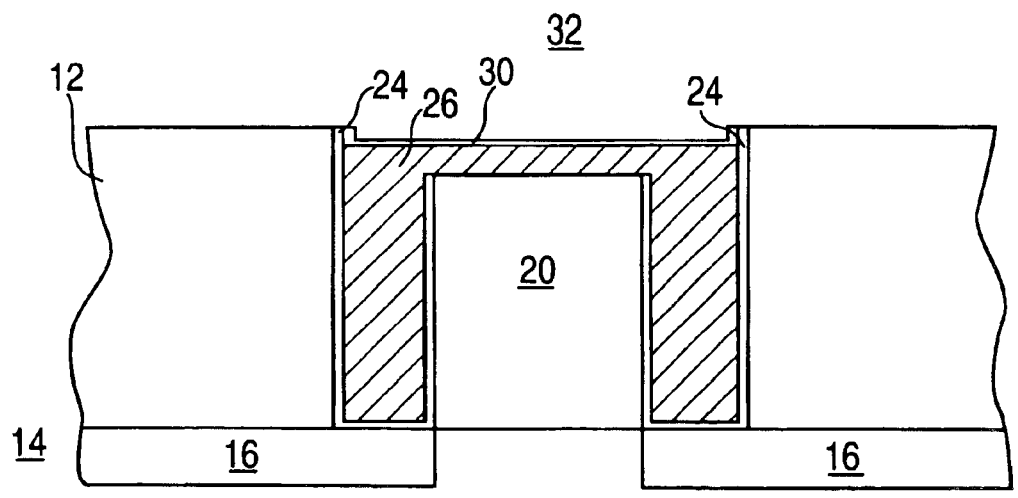

As shown in FIG. 7, a conductive path is created between wiring segments 16 after the deposition of a conductive layer 30 upon passivation layer 12, down into recess 28, and across organic material 26. The material for conductive layer 30 may be selected from the same materials as the liner material 24, or from different materials altogether. Finally, in FIG. 8, a fuse structure 32 is fully defined after the removal of the conductive layer from the top of passivation layer 12. Preferably, the removal is implemented by another CMP step. This time, however, a stiff or hard pad is used in conjunction with the polishing because dishing is unwanted. Alternatively, an etch process could be used to remove conductive layer 30 from the top of passivation layer 12. A negative photo resist (not shown) would preferably cover recess 28 (as well as the portion of conductive layer located therein). Then, the remaining uncovered conductive layer 30 across the passivation layer 12 is etched away.

Thus formed, fuse structure 32 provides an energy-dissipative device having an organic material encapsulated beneath a conductive layer. When the conductive layer 30 of fuse structure 32 is subjected to a beam of energy, such as from a laser, the organic material 26 encapsulated underneath the conductive layer 30 is rapidly heated and volitalized. As a result, the thin conductive layer 30 is explosively opened, thereby opening the fuse structure. Because of the presence of the organic material 26, the laser energy requirements for blowing the fuse structure 32 are reduced.

In an alternative embodiment of fuse structure 32, the formation of conductive layer 30 could be eliminated altogether if a suitable electrically conductive polymer, such as Ormecon® is chosen as the organic material 26. Referring once again to FIG. 5, the fuse structure 32 could be completely defined at that stage of the process if the organic material 26 were to have sufficiently low resistivity and gap-filling properties so as to complete a circuit between wiring segments 16. For such an embodiment, the fuse structure 32 would be fused open by application of a laser beam directly to the organic material 26, such that the ensuing volatility of the organic material 26 creates an open circuit over the top of mesa region 20.

It will also be appreciated that although the fuse structure 32 is described above as preferably being formed within a passivation layer 12 of a semiconductor device, the same could also be formed within lower levels of the device. For instance, the vias 18 could also be formed within an intermediate level of insulation for contact with a lower wiring layer. In such a configuration, however, no organic material would be included at or above the intermediate level. Since any organic layers not included within a fuse structure would understandably be volatilized by a laser beam, any semiconductor layers at or above a layer containing such a fuse structure should be organic-free. Furthermore, any insulating layers above a fuse structure 32 formed at lower levels would preferably be thinned or removed altogether by a suitable etch, so as to provide an escape path for the exploded organic material.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A laser-programmable fuse structure for an integrated circuit device, comprising:

a conductive layer, said conductive layer completing a conductive path between wiring segments included in a wiring layer; and an organic material encapsulated underneath said conductive layer and in continuous contact with said conductive layer;

wherein the fuse structure is blown open by application of a beam of laser energy thereto.

2. The fuse structure of claim 1, further comprising:

a liner material in electrical contact with said wiring segments and said conductive layer, said liner material further encapsulating said organic material between said wiring layer and said conductive layer.

3. The fuse structure of claim 1, wherein said organic material is selected from a group that includes a polyimide, a polyamide, a polyarlyene ether, a polyaromatic hydrocarbon (PAH), and a conductive polyaniline.

4. The fuse structure of claim 2, wherein said liner material is selected from a group that includes TaN, Ta, TiN, Ti, W, WN, TaSiN, TiSiN, or alloys therefrom.

5. The fuse structure of claim 1 wherein said conductive layer is selected from a group that includes TaN, Ta, TiN, Ti, W, WN, TaSiN, TiSiN, or alloys therefrom.

6. The fuse structure of claim 2, further comprising:

a pair of vias formed within an insulating layer and extending down to said wiring segments; and a mesa region of said insulating layer formed between said pair of vias;

wherein said liner material is formed upon sides of said mesa region and said wiring segments.

7. The fuse structure of claim 6, wherein said pair of vias is filled with said organic material.

8. The fuse structure of claim 7, wherein said organic material further occupies an inner area of the fuse structure, said inner area between the top of said mesa region and said conductive layer.

9. The fuse structure of claim 8, wherein said conductive layer covers said inner area and said organic material, thereby completing said conductive path.

* * * * *